United States Patent [19]

Bednarz et al.

[11] Patent Number: 4,874,722
[45] Date of Patent: Oct. 17, 1989

[54] PROCESS OF PACKAGING A SEMICONDUCTOR DEVICE WITH REDUCED STRESS FORCES

[75] Inventors: George A. Bednarz, Plano; Reginald W. Smith, Arlington; Gretchen W. Roeding, Carrollton; Howard R. Test, Plano, all of Tex.

[73] Assignee: Texas Instruments Incorporated, Dallas, Tex.

[21] Appl. No.: 188,185

[22] Filed: Apr. 28, 1988

Related U.S. Application Data

[62] Division of Ser. No. 40,449, Apr. 16, 1987, abandoned.

[51] Int. Cl.⁴ .......................................... H01L 25/02
[52] U.S. Cl. ..................................... 437/209; 29/825; 29/739; 156/69; 174/52.1; 206/331; 264/276; 437/214
[58] Field of Search ...................... 437/209, 217, 214; 156/69; 174/52 PE, 52 FP, 52 S; 29/855, 739, 825; 206/331; 203/332

[56] References Cited

U.S. PATENT DOCUMENTS

| | | | |
|---|---|---|---|
| 4,079,511 | 3/1978 | Grabbe | 29/627 |
| 4,079,511 | 3/1978 | Grabbe | 357/74 |
| 4,109,818 | 8/1978 | Hascoe et al. | 156/307.7 |
| 4,303,934 | 12/1981 | Stitt | 357/74 |
| 4,507,907 | 4/1985 | Wolfson | 156/69 |

FOREIGN PATENT DOCUMENTS

| | | | |
|---|---|---|---|
| 58-130553 | 8/1983 | Japan | 357/75 |
| 0239043 | 11/1985 | Japan | 437/217 |

Primary Examiner—Brian E. Hearn
Assistant Examiner—Beverly A. Pawlikowski
Attorney, Agent, or Firm—B. Peter Barndt; James T. Comfort; Melvin Sharp

[57] ABSTRACT

A method of producing a cavity package semiconductor device is disclosed. The method includes providing a bar pad having a plurality of bar pad straps, each strap extending outwardly from the outer edge of the bar pad and spaced about the edge of the bar pad; mounting integrated circuits having bond pads on the bar pad; molding a packing material onto a central portion of lead fingers and the bar straps to grip and surround each lead finger with package material, with a portion of each lead finger extending externally from the ring at both the exterior and interior thereof and to secure the bar pad straps therein; electrically coupling the bond pads to the portion of desired ones of the lead fingers extending toward the interior of the ring; and enclosing both ends of the ring to provide a cavity in the ring to suspend a bar pad with the integrated circuit thereon within the cavity with the bar pad straps.

8 Claims, 4 Drawing Sheets

PROCESS OF PACKAGING A SEMICONDUCTOR DEVICE WITH REDUCED STRESS FORCES

This application is a division of application Ser. No. 040,449 filed Apr. 16, 1987, abnd.

BACKGROUND OF THE INVENTION

1. Field of the Invention

This invention relates to integrated circuit device manufacturing, and more particularly, to the manufacture of molded packages for a semiconductor integrated circuit chip.

2. Description of the Related Art

Integrated circuit chips are becoming more complex through higher circuit densities, which is achieved through use of smaller feature sizes in the construction of these circuits. Circuit feature sizes as small as one micron are now possible, with further reductions planned in the near future. With these higher densities, the thin film construction of stacked layers of metal conductors, insulating oxides, transistors, and various other such features of the integrated circuit chips, gives rise to mechanical and thermal stress management problems. These stresses are produced by the interaction of hard thermoplastic or thermoset plastic (such as epoxy) packaging material with the integrated circuit chips, and even relatively small stresses can damage the small features on these chips. Stresses on the integrated circuit chip may be induced by coefficient of expansion and modulus of elasticity differences between the materials used in construction of an integrated circuit (including any leadframe and wire bonds) and its surrounding molded package. These induced stresses often produce chip passivation cracking and metal conductor line shearing and breakage during temperature cycling or similar operating thermal stress tests. Such damage becomes evident with single layer metal conductor chips having areas as low as forty thousand square mils and can also appear with multiple layer metal conductor chips having areas as small as twenty thousand square mils. In general, larger chips are subjected to more stresses than are smaller ones.

Attempts to reduce the stresses on chips through the use of low modulus of elasticity polymeric coatings have been only partially successful. The polymeric coating typically has a high coefficient of thermal expansion and when the overcoated circuit is encapsulated with the hard thermoset or thermoplastic, damage can still result at the chip surface and to the electrical connections (wire or beam lead bonds) from the chip to the external package leads. The use of a direct encapsulating thermoset or thermoplastic molding compound with a lower modulus of elasticity and a better match of coefficients of thermal expansion, is not an option without sacrificing other desirable thermal, chemical, mechanical and electrical performance properties.

Prior art proposals to solve the stress problem include cavity packages in premolded configuration. These proposed premolded packages mostly have been based on high temperature thermoplastic materials, however, some reference has been made to the use of thermoset plastics. These cavity packages are molded around a leadframe prior to chip assembly and must be made acceptable for subsequent chip mount and bonding. This requires deflashing and/or precleaning to prepare the various parts of the leadframes for subsequent chip attachment and electrical connection or bonding operations. Such leadframe parts may include the bar pad (chip attach pad) and the inner ends of the lead fingers. The processes of making electrical bonds between the chip terminal (or bonding) pads to the external leads, especially wire bonding, require a clean surface free from organic residue such as molded flash. Flash is unwanted plastic adhering to parts of the leadframe where it does not belong, and is produced during the molding process. Deflashing (removal of flash) can be accomplished either by mechanical or chemical means. Both deflashing processes present problems for the integrated circuit device assembly process.

Mechanical deflash can do irreversible damage to the thin gold or silver plate on the bar pad and inner ends of the lead fingers. The plate is required to make good diffusion bonds between the bond wire, or interconnect leads, and the lead fingers, and to make a good mechanical and/or electrical connection between the chip and the bar pad. Also, after mechanical deflash, a cleaning process is required to ensure that the bar pad and lead fingers have the cleanliness required for good connections to be made.

Chemical deflash can be as detrimental as mechanical deflash if not done properly. The chemicals used for both thermosplastics and thermosets work on the principle of attacking the interface of the flash to the metal leadframe in order to loosen the flash. Effective cleanup is required to ensure the removal of all contaminants from within the package, including residues of the deflash chemicals. Residues and other contaminants left within the package can cause latent reliability problems as these contaminants can chemically attack the packaged integrated circuit.

An additional disadvantage of the premolded package centers on the molding material. Thermoplastics, even high temperature thermoplastics, pose some restrictions on which chip attach adhesives and bonding processes can be employed to assemble the packaged integrated circuit device. Heat can cause the thermoplastic packaging material to emit gasses which can adversely affect the bonding operations. Thus, to avoid this, the chip mount adhesive cure temperature must be kept to a minimum, thereby limiting the types of adhesives which can be used. Similar problems can also occur with thermoset packaging material.

A further problem with thermoplastics is caused by the instability and softness of the packaging material when it is heated beyond the glass transition temperature for the material. At the glass transition temperature the packaging material becomes softer and more unstable, and the coefficient of thermal expansion of the packaging material increases rapidly with increasing temperature above the glass transition temperature. Thus, it becomes difficult to form good bonds because of the softness and instability of the packaging material supporting the leadframe and chip. Again, similar problems can arise with the use of thermoset plastics as packaging material.

Thermoplastics and thermosets are poor conductors of heat, which makes it difficult to transfer heat through the packaging material, upon which the bar pad rests, to the chip where the heat is required for such bonding processes as thermosonic bonding. This automatically dictates that the bonding processes be ultrasonic or very low temperature thermosonic, neither of which is as effective, with respect to bonding speed, as thermosonic bonding is at two hundred plus degrees Centigrade.

A further disadvantage of premolded cavity packages is that the bar pad is in contact with the packaging material. The leadframe material (including bar pad) and the packaging material have differing coefficients of thermal expansion which contributes to stresses arising at the places of contact.

FIG. 1 illustrates the process flow for construction of integrated circuit devices using premolded packages. Starting with molding compound at 1 and leadframe material at 2, the bottom part of the package is molded around the leadframe at 3. The leadframe is deflashed as necessary at 4 and any chemical residues removed at 5. If the packaging material is thermoplastic, the wafers are sawed to produce chips at 6 and the chip is adhesively mounted to the final removal of foreign material is carried out at 14. A gel such as silicone is introduced within the cavity of the package at 15 to keep out moisture and is cured at 16. The package lid is cleaned at 17 and the lid seal adhesive is preformed at 18. The lid with adhesive preform in place is placed on the bottom part of the package to seal the package at 19 and the adhesive is cured at 20. The package receives its final trim and form at 21 and is marked and labelled at 22 and electrically tested at 23. It can be seen that the prior art process using a premolded cavity package involves a considerable number of expensive steps.

Other prior art approaches using cavity packages are all similar in that the bar pads are in contact with the packaging material, which gives rise to the problems mentioned above where the leadframe and package have differing coefficients of thermal expansion. As with the premolded package, unwanted stresses can be generated upon the bar pad by the touching package material. Also as before, the packaging material makes it difficult to transfer effectively heat through the package to the bar pad. Thus, ultrasonic or low temperature thermosonic bonding are the only interconnection method options.

SUMMARY OF THE INVENTION

A cavity package and process are provided in which the sides of the package are molded in a ring protruding from both faces of a leadframe, forming an upper cavity above the bar pad and a lower cavity below the bar pad. The upper cavity is sealed from the exterior by a package upper lid and the lower cavity is sealed from the exterior by a package lower lid. The ring and the two lids form the package for the integrated circuit device. The upper and lower cavities together form a main cavity within the package in which one or more integrated circuit chips are suspended. The chip or chips and bond wires or interconnect leads preferably do not touch either the lids or the ring. In any case, they are sufficiently free of the packaging material so that thermal expansion and contraction of the package do not produce stresses in the integrated circuit chip or in the bond wires or interconnect leads.

The Invention provides for electrically bonding the integrated circuit chip to the leads prior to molding the ring onto the leadframe.

The cavity package of the invention significantly reduces stress on the chip surface. Measurements using silicon chips have shown five to ten fold reductions in the stress from the stress produced in directly encapsulated chips. Thus, the invention is particularly useful with large size chips and chips having small circuit features. Specifically, the reduction in stress is key to the successful packaging of high density single level metal LSI and VLSI chips larger than fifty thousand square mils, high density double level metal interconnection chip and multiple chip subsystems.

Since the invention provides for bonding of the integrated circuit to the external leads prior to packaging, there are no restrictions in chip mount or bond assembly processes. That is, high temperature thermosonic bonding can be used without heat loss in the package material and without the problems of softening the packaging causing lead and chip movement found in the prior art. Likewise, there is more flexibility in selecting packaging materials since there is little or no interaction of the package with the bonding process.

Multiple chip subsystems can be packaged with the cavity package of the invention since there is no direct contact of the chips with the package. That is, there are fewer constraints on the shape of what is put in the chip main cavity than is true with the prior art.

The invention does not require the temperature limitations of prior art devices. Thus, there is no restriction as to which organic adhesives to use for chip attachment, and no requirements to use soft solder mounts or gold eutectic alloy mounts, which are problems and requirements of prior art devices.

There are no temperature limitations required by the invention with respect to processes interconnecting chip terminals or bond pads to leadframe lead fingers or substrates. For gold wire bonding, thermosonic or thermocompression can both be employed. Tape Automated Bonding (TAB) beam lead diffusion thermocompression of reflow tin or solder bonds are possible. Interconnective bonding to a substrate mounted on the bar pad of a leadframe is also possible since there are no temperature limitations.

Since the chip, or multiple chips, are already assembled before molding the package ring, there are no associated outgassing problems at bonding as are associated with premolded packages. Therefore, more consistent, reliable bonds are achieved.

No chemical or mechanical deflashing is required since the package ring is molded in a position sufficiently far from the inner ends of the lead fingers and the bar pad to prevent flashing from getting on them. Thus, no chemical cleanup is required to insure that deflash residues are totally removed from the bar pad and the inner ends of the lead fingers. This ensures that no damage is done to the thin gold or silver plate at these locations.

No change in the transfer molding process is required except for mold design, with respect to direct encapsulation. No molding compound changes are required. Materials already qualified can be used to take advantage of known property performance characteristics.

Prior to the lids being affixed to the package ring, the main cavity is open to the outside from both above and below the package ring, thus, access to the chip and/or bar pad is possible from both above and below. This greatly simplifies the bonding process since the chip may be heated from below without the necessity of passing the heat through plastic packaging material below the chip.

The number of steps required to produce a finished, packaged integrated circuit device are fewer than required by prior art cavity mold processes.

DESCRIPTION OF THE PREFERRED EMBODIMENTS

Figure 1:
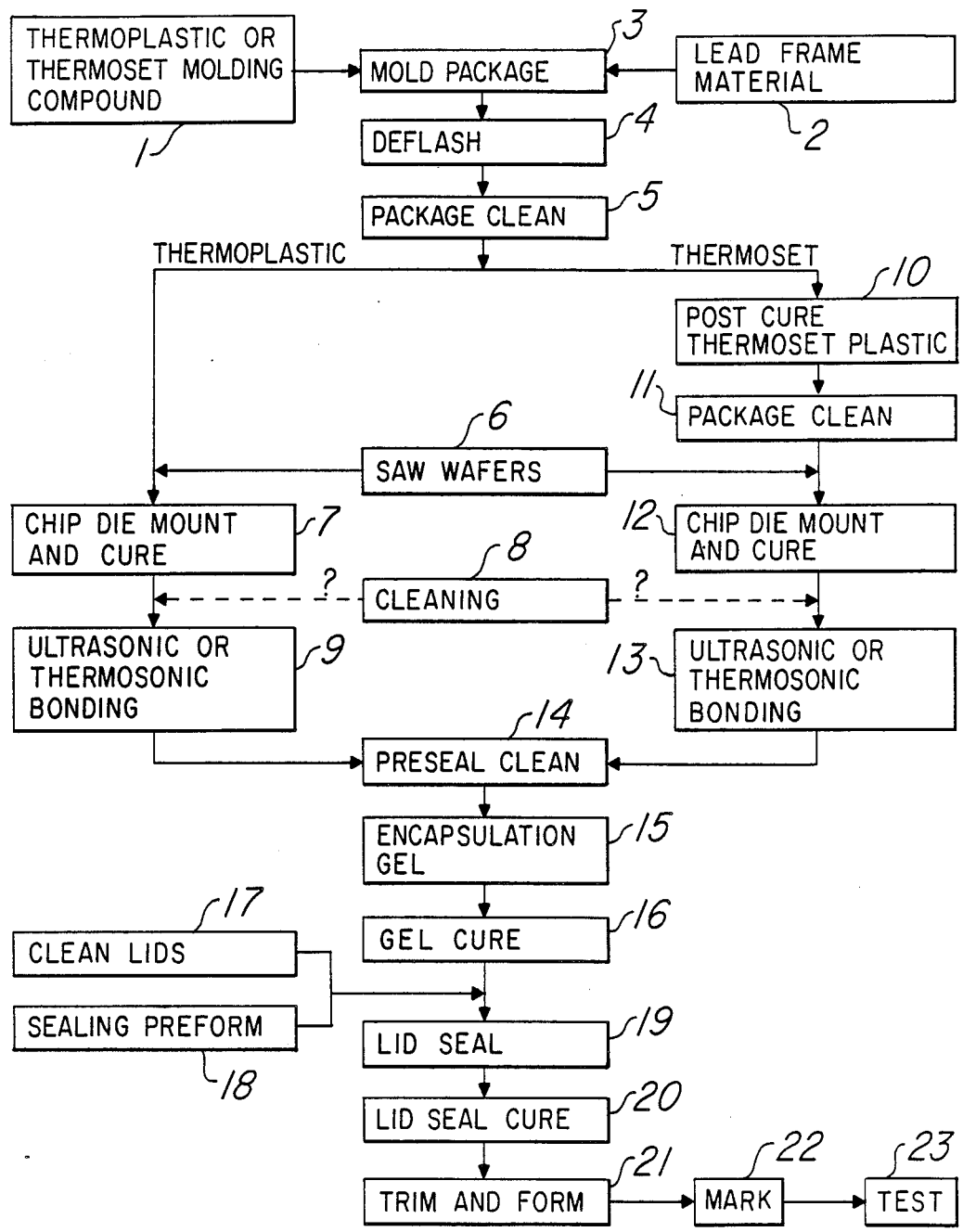
FIG. 1 is a flow diagram of a prior art IC device manufacturing process using a prior art premold cavity package.
Figure 2:
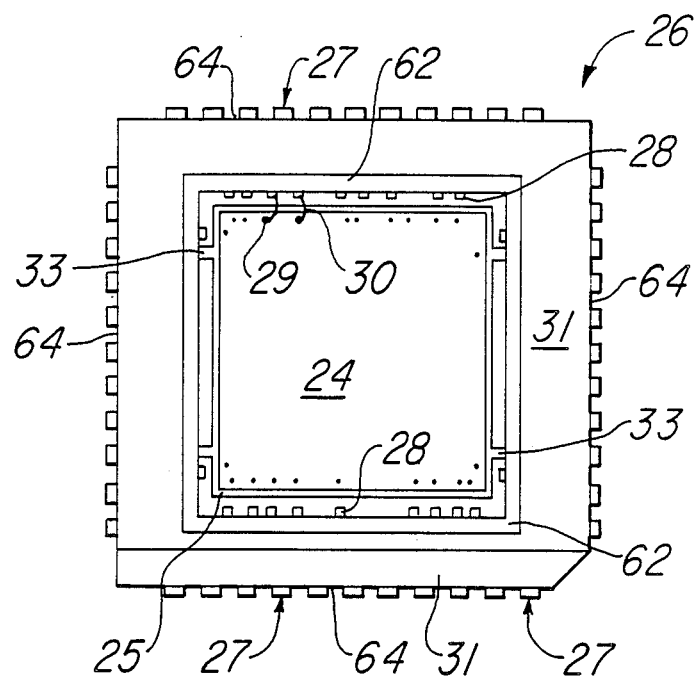
FIG. 2 is a plan view of the package ring of the invention in place as part of a PLCC style integrated circuit device. For simplicity, not all the lead finger inner ends or all the bond pads and wire bonds ar shown.
Figure 3:
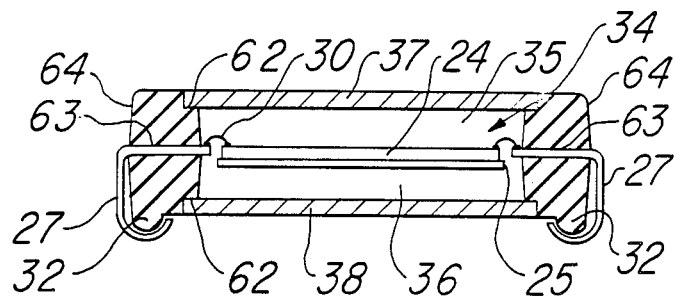
FIG. 3 is a side sectional view of the device of FIG. 2, but with upper and lower package lids in place.

FIGS. 2 and 3 illustrate an embodiment of the invention as used with a single large chip 24 on bar pad 25 of PLCC style integrated circuit device 26. Lead fingers 27 have inner ends 28 which are wire bonded to bond pads 29 on the face of the chip 24 by bond wire 30. The bonding process can be carried out by high temperature thermosonic bonding or by thermocompression bonding. The thermosonic bonding can be carried out at two hundred plus degrees Centigrade for high speed bonding. The lead fingers 27 and bar pad 24 were part of an interconnected leadframe upon which was transfer molded the package ring 31. The integrated circuit device shown in FIGS. 2 and 3 has had a trim and form operation performed on it subsequent to molding so that the individual lead fingers 27 and the bar pad 25 are no longer interconnected. As can be seen in FIG. 3, the lead fingers 27 are bent around the lower projection 32 of package ring 31.

Figure 7:
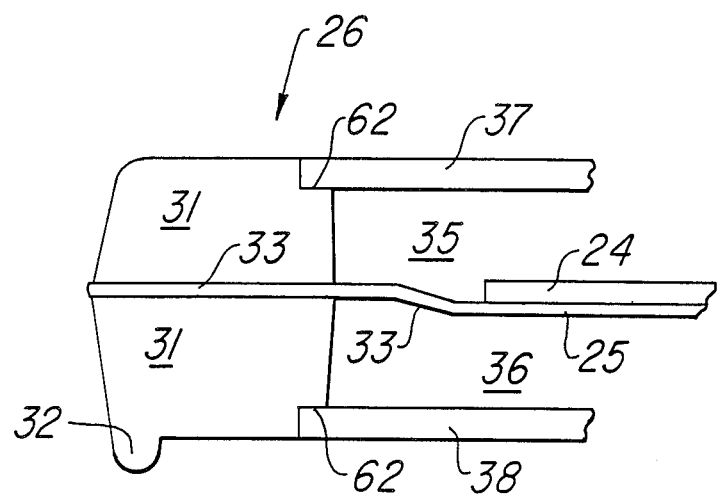
FIG. 7 is a side sectional view of the integrated circuit device of FIG. 2.

Package ring 31 preferably is comprised of a thermoplastic or a thermoset plastic. The ring 31 forms the four walls of the package of the integrated circuit device 26, and also functions to grips and support the individualized lead fingers 27 in their proper positions. This is illustrated in FIG. 3 at 63 where the packaging material firmly grips the lead fingers 27 which extend through the package ring walls 64. The package ring 31 also functions to firmly grip the four bar pad straps 33 to suspend the bar pad 25 and the semiconductor chip 24 mounted upon it in a position approximately centered vertically and horizontally in the main cavity 34 so that the upper cavity 35 and lower cavity 36 are approximately equal in volume. FIG. 7 shows bar pad strap 33 in detail and shows the bar pad strap anchored in the package ring 31 where the packaging material is molded to surround a portion of the bar pad strap as shown in FIG. 7. This surrounding packaging material at 63 serves to grip the bar pad straps and suspend the bar pad and chip in their approximately centered position within the main cavity. The centered bar pad 25 and integrated circuit chip 24 do not touch the ring 31 directly, nor do they touch the package upper lid 37 or the package lower lid 38. Thus, thermal expansion or contraction of the package ring 31 or lids 37 and 38 does not generate large forces on the bar pad 25 or chip 24. The package lids 37, 38 are affixed to lid shelves 62 to seal the main cavity 34 from the outside. A glass sealing preform is used to seal each lid in place. The preforms are epoxy impregnated glass mats.

Figure 4:
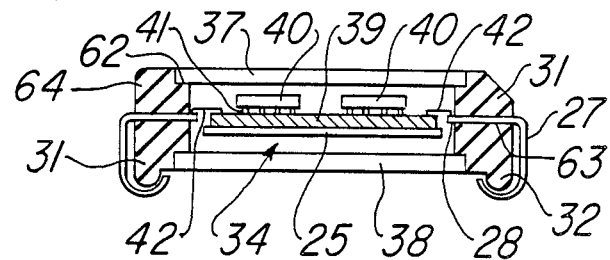
FIG. 4 is a side sectional view of a multi-chip, flip-chip PLCC style integrated circuit device with upper and lower package lids in place.

The invention can also be used for multi-chip, flip-chip integrated circuit devices, as illustrated in FIG. 4. In this application of the invention, a substrate 39 is affixed to the upper surface of the bar pad 25. Two integrated circuit flip-chips 40 are reflow soldered face down to a metallized circuit on the upper surface of the substrate 39. The flip-chips have bumps 41 on their faces which make electrical contact with the integrated circuits on the flip-chips. The bumps 41 are electrically and mechanically connected to the metallized circuit on the substrate 25 by the reflow soldering process. Interconnect wires 42 are bonded to the inner ends 28 of the lead fingers 27 and to contact points on the surface of the substrate 39 to electrically connect the flip-chip integrated circuits to the lead fingers. The bar pad 25, substrate 39, and flip-chips 40 are straps similar to those shown in FIG. 7. Thus, thermal expansion and contraction does not develop large stresses in the bar pad, substrate or flip chips.

Figure 5:
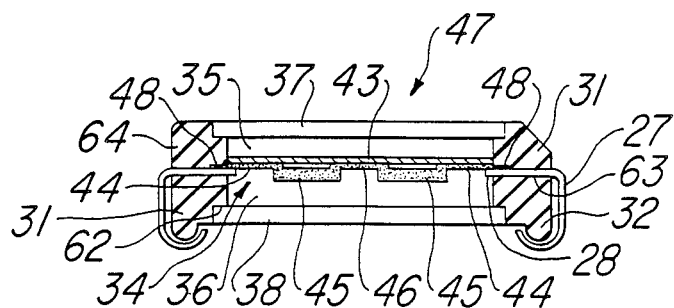
FIG. 5 is a side sectional view of a multi-chip, Tape Automated Bonded PLCC style integrated circuit device with upper and lower package lids in place.

A further application for the invention is shown in FIG. 5, where the package of the invention is used to encapsulate two integrated circuit chips affixed to film 43. The film 43 carries interconnect leads 44 and 46 affixed to its lower face. The film 43 and interconnect leads are used to assemble the integrated circuit device 47 with the aid of a Tape Automated Bonding process. Two integrated circuit chips 45 have had contact pads on their faces reflow soldered to the interconnect leads 44 and 46 electrically to connect the integrated circuits to the interconnect leads 44, and mechanically to support the two chips 45. The interconnect leads 44 are also bonded to lead fingers 27 electrically to connect the integrated circuits to the lead fingers. The Integrated circuit chips 45 are suspended midway in main cavity 34 by film 43 which is held by package ring 31 at locations 48. The package ring 31 has been molded to enclose the film at those points. Since the film is flexible and the chips 45 do not touch the packaging material, no large stresses are exerted upon the chips.

Although FIGS. 2-5 and 7 depict PLCC's, the invention is equally applicable to other package styles, such as DIP's. The process flow of the invention, illustrated in FIG. 6, is applicable to a variety of package styles, including PLCC's and DIP's.

Figure 6:
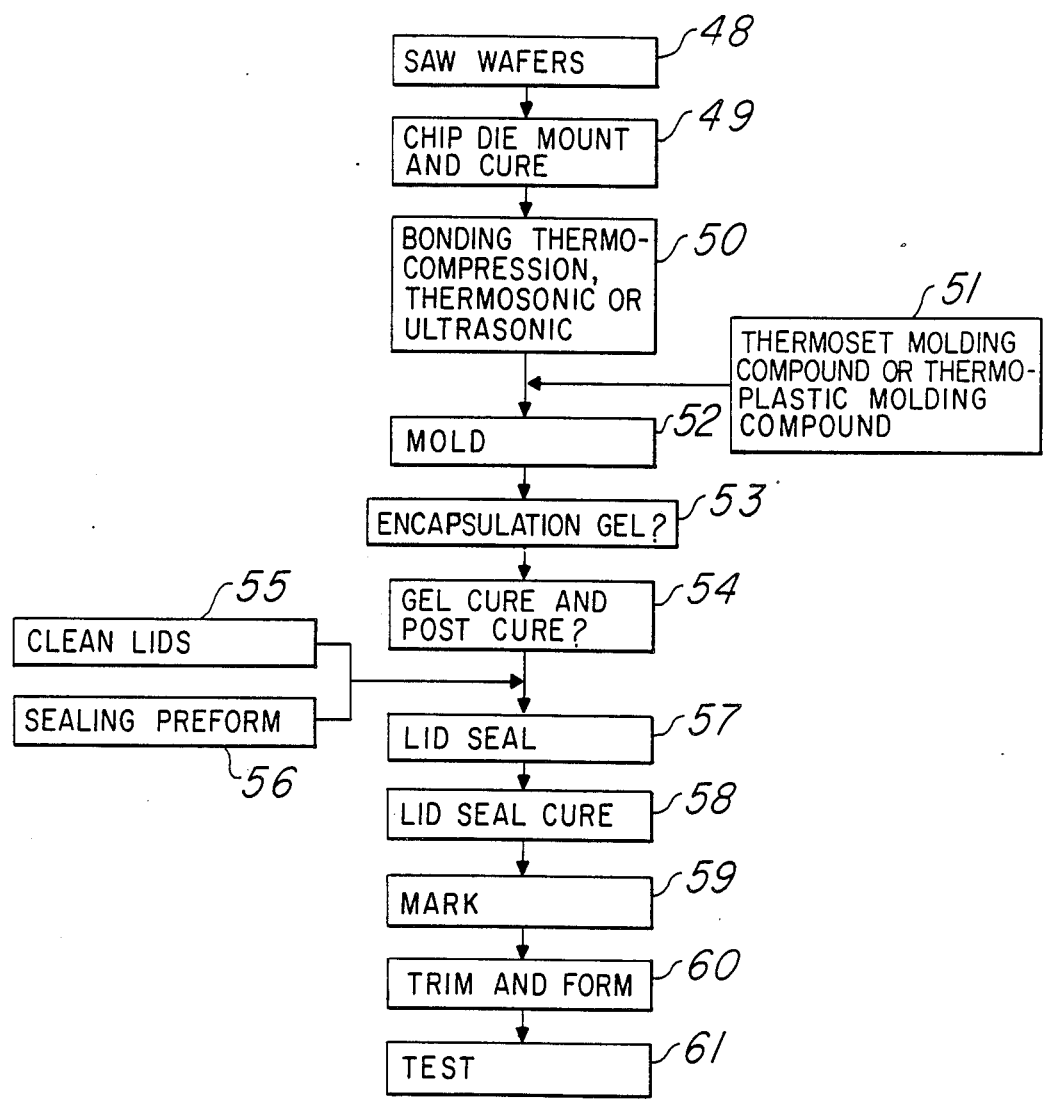
FIG. 6 is a flow diagram of an embodiment of the IC device manufacturing process using the cavity package of the invention.

As shown in FIG. 6, wafers are sawed at 48 to singulate them into individual integrated circuit chips. A chip is mounted on a bar pad and affixed to the pad with an adhesive, which is then cured, at 49. Bonding takes place at 50 with the chip affixed to its bar pad and before any other packaging steps have been carried out. The bonding can use bond wires or interconnect leads, and thermocompression, thermosonic, or ultrasonic bonding can be used. A thermoset or thermoplastic molding compound has been prepared at 51, and a package ring is molded onto the leadframe at 52. The package ring surrounds the chip mount area (such as a bar pad) and projects from both faces of the leadframe, forming upper 35 and lower 36 cavities. As indicated at 53, an encapsulation gel may be injected into the upper and lower cavities if desired. The gel has a low modulus of elasticity and serves to retard moisture from reaching the integrated circuit chip. The low modulus of elasticity prevents the gel from exerting large stresses upon the chip, bonding wires or interconnects, and the bar pad if present. If gel has been used, it is cured and post cured at 54. The upper 37 and lower 38 package lids are cleaned at 55 in preparation for use at 57 where they are placed on the lid shelves 62. The adhesive for affixing the lids to the package ring are prepared at 56. The adhesive is a glass sealing preform, which is a glass mat impregnated with epoxy. The sealing preform and lids are placed in position to seal the upper and lower cavities at 57. The adhesive is cured at 58. The assembled package is marked with a part number at 59 and finished by trim and form at 60. The completed integrated circuit device is tested electrically at 61.

Although the invention has been illustrated and discussed with some degree of particularity, this is not meant to limit the application of the invention, which can be practiced in a variety of embodiments.

We claim:

1. A method of producing a cavity package semiconductor device, comprising the steps of:
   (a) providing a bar pad having a plurality of bar pad straps, each said bar pad strap extending outwardly from the outer edge of said bar pad and spaced about the edge of said bar pad;
   (b) mounting a integrated circuit having bond pads thereon on said bar pad;
   (c) providing a plurality of lead fingers;
   (d) molding a package material ring onto a central portion of each said lead fingers and said bar pad straps to grip and surround each said lead finger with said package material, with a portion of each said lead finger extending externally of said ring at both the exterior and interior thereof and to secure said bar pad straps therein;
   (e) electrically coupling said bond pads to the portion of predetermined ones of said lead fingers extending toward the interior of said ring; and
   (f) enclosing both ends of said ring to provide a cavity in said ring to suspend said bar pad with integrated circuit thereon within said cavity with said bar pad straps.

2. The method of claim 1 wherein said ring is rectangular in shape.

3. The method of claim 1, further including the step of injecting an encapsulation gel into said cavity.

4. The method of claim 2, further including the step of injecting an encapsulation gel into said cavity.

5. The method of claim 1, further including the step of providing a surface on said bar pad having electrically conductive paths thereon, providing bumps on the bar pads of said integrated circuit and securing said bumps to predetermined locations on said electrically conductive paths.

6. The method of claim 2 further including the step of providing a surface on said bar pad having electrically conductive paths thereon, providing bumps on the bar pads of said integrated circuit and securing said bumps to predetermined locations on said electrically conductive paths.

7. The method of claim 3, further including the step of providing a surface on said bar pad having electrically conductive paths thereon, providing bumps on the bar pads of said integrated circuit and securing said bumps to predetermined locations on said electrically conductive paths.

8. The method of claim 4, further including the step of providing a surface on said bar pad having electrically conductive paths thereon, providing bumps on the bar pads of said integrated circuit and securing said bumps to predetermined locations on said electrically conductive paths.

* * * * *